(12) United States Patent
Park

(10) Patent No.: US 7,184,355 B2
(45) Date of Patent: Feb. 27, 2007

(54) MEMORY BANK STRUCTURE

(75) Inventor: Byung-Il Park, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/023,980

(22) Filed: Dec. 29, 2004

(65) Prior Publication Data

US 2006/0092747 A1   May 4, 2006

(30) Foreign Application Priority Data

Oct. 30, 2004   (KR) .................. 10-2004-0087669

(51) Int. Cl.
*G11C 8/00*   (2006.01)
(52) U.S. Cl. .................. 365/230.03; 365/203
(58) Field of Classification Search ............ 365/230.03
See application file for complete search history.

(56) References Cited

U.S. PATENT DOCUMENTS

| 5,404,338 A | 4/1995 | Murai et al. |
| 5,594,704 A | 1/1997 | Konishi et al. |
| 5,781,496 A | 7/1998 | Pinkham et al. |
| 5,956,285 A | 9/1999 | Watanabe et al. |
| 6,163,493 A | 12/2000 | Yamagata et al. |
| 6,198,679 B1 | 3/2001 | Nakasu et al. |
| 6,239,626 B1 | 5/2001 | Chesavage |
| 6,477,630 B2 * | 11/2002 | Ji et al. .................. 365/230.03 |
| 6,505,269 B1 * | 1/2003 | Potter .......................... 711/202 |
| 2002/0131316 A1 | 9/2002 | Noh |
| 2004/0240290 A1 | 12/2004 | Lee |

* cited by examiner

*Primary Examiner*—Thong Q. Le
(74) *Attorney, Agent, or Firm*—McDermott Will & Emery LLP

(57) ABSTRACT

The present invention relates to a memory bank structure. The memory bank structure includes: a plurality of sub-banks identified by a predetermined additional address; a plurality of local input/output line precharge units for precharging local input/output lines included in each of the sub-banks; and a plurality of local input/output line precharge control units for controlling a precharge operation of the plurality of local input/output line precharge units. Under this specific memory bank structure, the precharge operation is performed selectively at predetermined regions of the memory bank structure and as a result, unnecessary power dissipation is reduced.

13 Claims, 8 Drawing Sheets

MEMORY BANK STRUCTURE

FIELD OF THE INVENTION

The present invention relates to a memory bank structure including a circuit that precharges data input/output lines in a semiconductor memory device; and more particularly, to a memory bank structure for an effective precharge of data input/output lines in a core region of a semiconductor memory device.

DESCRIPTION OF RELATED ARTS

A semiconductor memory device includes a plurality of memory banks each with a plurality of memory cells. A region where the plurality of memory banks are disposed is called a core region, and a region between the memory banks is called a peripheral region. Especially, in the peripheral region, there are data input/output lines for the memory banks.

Data transmitted from the peripheral region are inputted to the core region through write drivers placed adjacent to the core region, and data required to be transmitted to the peripheral region are outputted through input/output sense amplifiers placed adjacent to the core region.

Typically, data buses for transmitting inputted data to the core region through data input/output pins, which are also called DQ pins, are referred to as global input/output buses (GIO). Also, data buses connected to an interior side of the core region as the data buses are connected with the write drivers and/or the input/output sense amplifiers are referred to as local input/output buses (LIO). Hereinafter, both of the write driver and the input/output sense amplifier are referred to as a core driver/sense amplifier.

The local input/output buses have voltages in opposite logic values when the local input/output buses are activated. On the contrary, when the local input/output buses are inactivated, there are a number of local input/output line pairs maintaining the same precharge voltage. Also, one of the local input/output line pairs is connected with one specific core driver/sense amplifier, and data inputted/outputted to said one specific core driver/sense amplifier are accessed to a specific memory cell with a predetermined range of addresses. That is, the address assigned to the data is a clue for determining which data is inputted and outputted through which local input/output line pair.

Meanwhile, the current memory specification requires that input/output data are outputted through a specific input/output pin depending on an option of a data width that is specifically predetermined. On the basis of this requirement, if a memory device has 16 input/output pins under the assumption that the data width option is X16, data are inputted and outputted through 16 input/output pins. If the data width option is X8, then data are inputted and outputted through 8 input/output pins. Similarly, if the data width option is X4, data are inputted and outputted through 4 input/output pins.

One memory bank in a memory device with 16 input/output pins includes the same number of local input/output line pairs, and if the data width option is set to be X16, the local input/output line pairs and core driver/sense amplifiers connected to the local input/output line pairs are individually connected with the input/output pins. If the data width option is set to be X8, two of the local input/output line pairs are connected with one input/output pin in a time division mode. If the data width option is set to be X4, four of the local input/output line pairs are connected with one input/output pin in a time division mode.

FIG. 1 is a diagram showing a conventional precharge circuit for local input/output line pairs. The precharge circuit has a structure that simply receives a precharge instruction and supplies a precharge voltage VLIO to a corresponding local input/output line. This precharge circuit structure is applied identically to other local input/output lines and thus, the precharge of the local input/output line is simultaneously applied to all of the local input/output lines in the same memory bank.

However, the above precharge method is disadvantageous. Generally, read/write operation is carried out with respect to a memory cell to be accessed by using a row address and a column address. Particularly, consecutive read/write operations are carried out with respect to memory cells having a common row address. Thus, the row address is inputted at an initial stage, and column addresses are used to assign the memory cell to be accessed among the common memory cells.

There is not a serious problem of employing the above described addressing method when the data width option is X16, which is the full data width. However, when the data width option is X8 or X4, even though one specific region of the memory bank can be detected based on an inputted row address at the moment of reading/writing a specific data, the precharge is applied to entire regions of the memory bank. Thus, power is unnecessarily dissipated, and this problem becomes serious in mobile communication fields in which the power saving is one important factor.

SUMMARY OF THE INVENTION

It is, therefore, an object of the present invention to provide a memory bank structure capable of preventing power dissipation caused by precharging unnecessary local input/output buses.

It is another object of the present invention to provide a memory bank structure capable of assigning a region at which precharge of a local input/output line pair for read/write operation is carried out according to a data width option.

In accordance with an aspect of the present invention, there is provided a memory bank structure, including: a plurality of sub-banks identified by a predetermined additional address; a plurality of local input/output line precharge units for precharging local input/output lines included in each of the sub-banks; and a plurality of local input/output line precharge control units for controlling a precharge operation of the plurality of local input/output line precharge units.

In accordance with another aspect of the present invention, there is provided a memory bank structure, including: a top half bank used when the most significant bit of a predetermined additional address has a first logic value; a bottom half bank used when the most significant bit of the predetermined address has a second logic value; a top local input/output line precharge unit for performing a precharge operation with respect to local input/output lines in the top half bank; a bottom local input/output line precharge unit for performing a precharge operation with respect to local input/output lines in the bottom half bank; a top local input/output line precharge control unit for controlling the top local input/output line precharge unit; and a bottom local input/output line precharge control unit for controlling the bottom local input/output line precharge unit.

In accordance with still another aspect of the present invention, there is provided a memory bank structure, including: a first to a fourth sub-banks being usable according to a logic value of an additional address; a first to a fourth local input/output line precharge units for performing a precharge operation with respect to individual local input/output lines of the first to the fourth sub-banks; and a first to a fourth local input/output line precharge control units for controlling the first to the fourth local input/output line precharge units.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A memory bank structure in accordance with preferred embodiments of the present invention will be described in detail with reference to the accompanying drawings.

Herein, to define the term 'memory bank structure' used in the present invention, distinctive characteristics of a memory bank are first described.

In case of a large capacity memory device, there are a number of memory banks in one chip to improve addressing efficiency and to decrease power dissipation and ripple generation. Each of the memory banks includes an X decoder for decoding row addresses and a Y decoder for decoding column addresses. Also, when a data width option is full, data transmitted at one time through employing all data input/output pins of the chip are stored dispersively over entire regions of the memory bank. Thus, it is required to activate all regions of the memory bank to access the data stored dispersively.

In accordance with the preferred embodiments of the present invention, when the data width option is full, an address used within the memory bank necessary for assigning a memory region to be accessed within the selected memory bank is referred to as a basic address. When the data width option is not full, an address used along with the basic address for assigning a memory region to be accessed within the selected memory bank is called an additional address. Also, a data bus directly connected with a core driver/sense amplifier and allocated within a core region is referred to as a local input/output bus which is a group of data input/output lines.

Figure 1:
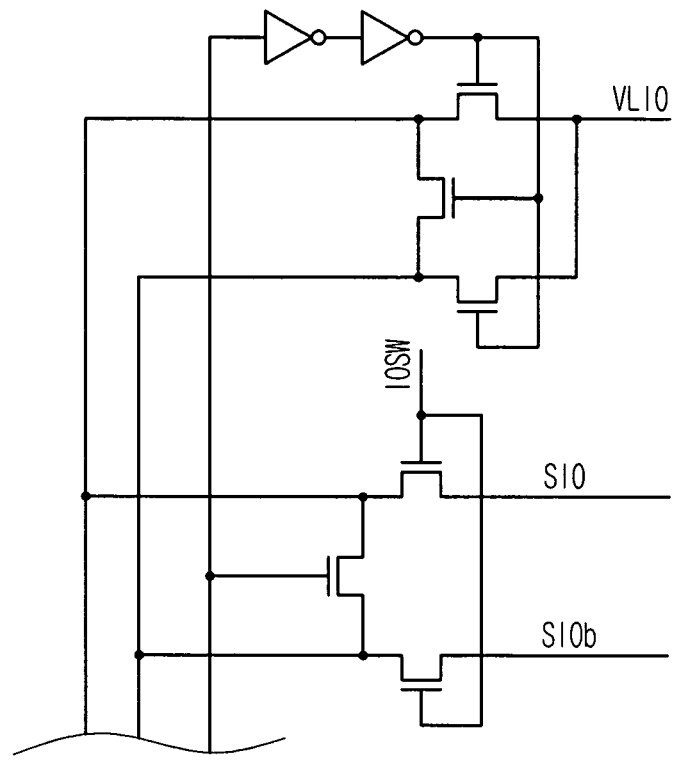
FIG. 1 is a circuit diagram showing a precharge unit in a conventional memory bank structure.
Figure 1:
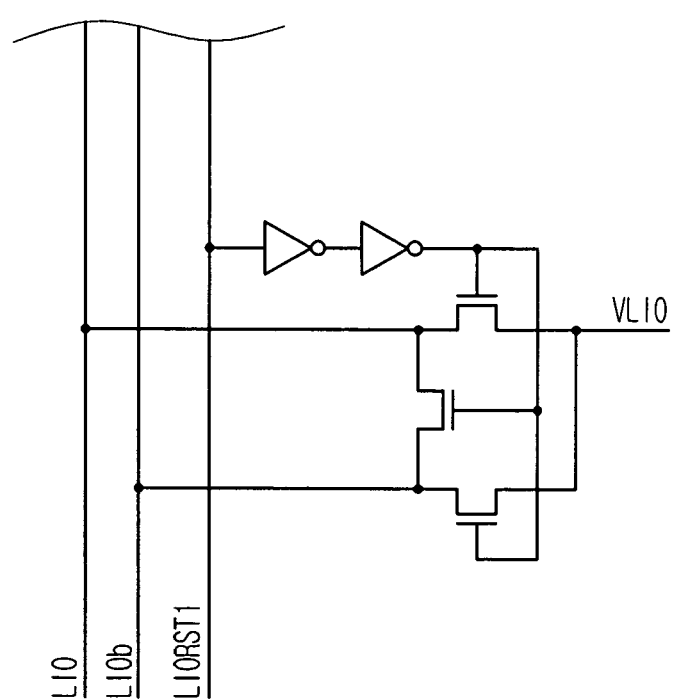
Figure 2:
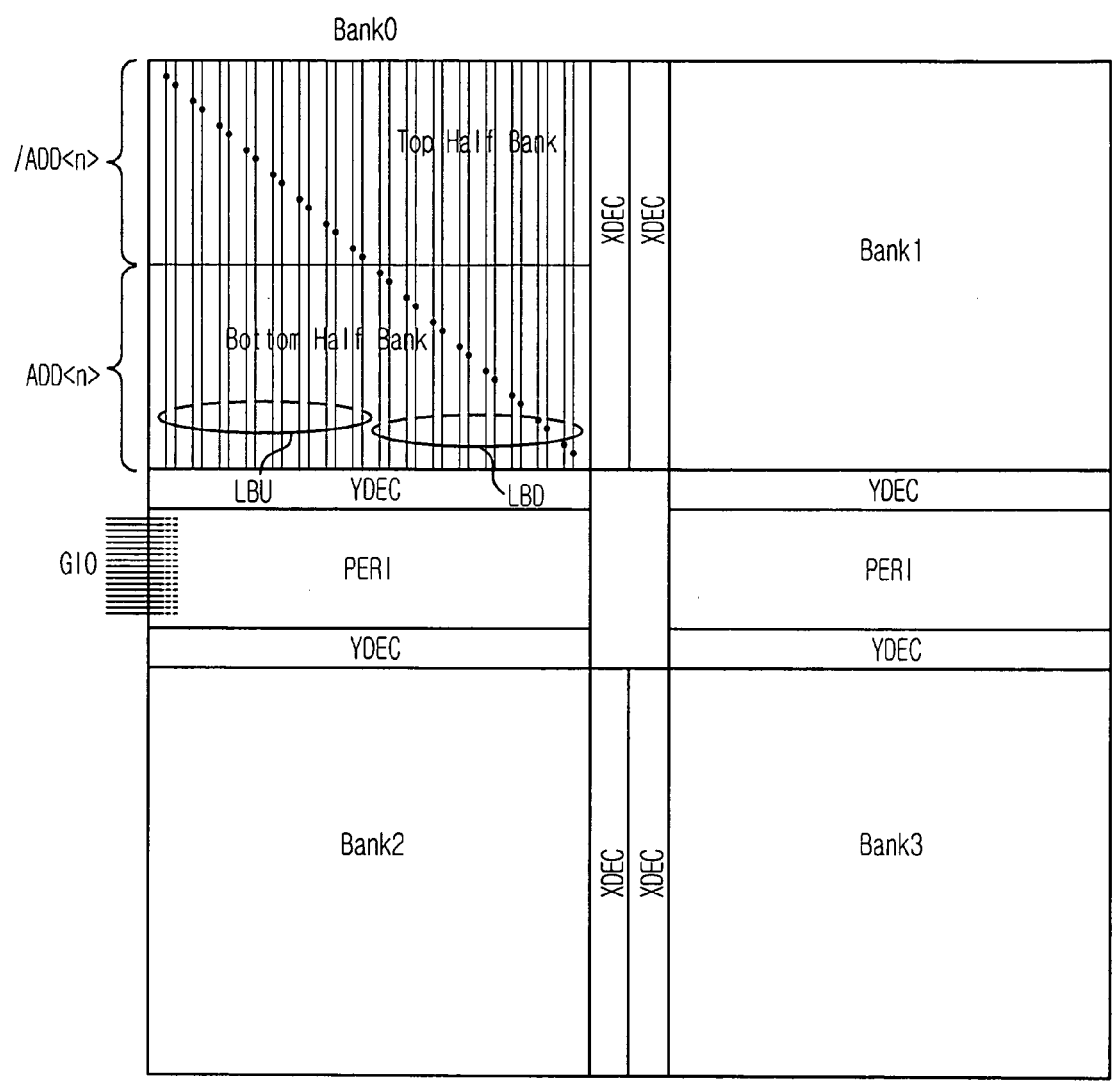
FIG. 2 is a diagram showing a memory bank structure in accordance with a first embodiment of the present invention.

FIG. 2 is a diagram showing a semiconductor memory device with a plurality of memory banks in accordance with the present invention. Herein, each memory bank Bank0, Bank1, Bank2, or Bank3 is divided into a top half bank used when the most significant bit (MSB) of a predetermined address is '1' and a bottom half bank used when the MSB of the predetermined address is '0'.

With reference to FIG. 2, a structure of the semiconductor memory device adopting a precharge control circuit will be described in detail.

A data inputted through external input/output pins in the semiconductor memory device is transferred to a memory bank in the core region through a global input/output bus allocated in a peripheral region. Then, write drivers (not shown) in the memory bank transfer the data inputted to the global input/output bus to the core region. A data line bus connected with the write drivers in the core region is called a local input/output line bus. During a read operation, input/output sense amplifiers amplify a data of the core region transferred to the local input/output bus and then transfer the amplified data to the global input/output bus.

Each of the memory banks Bank0 to Bank3 is classified physically into regions based on the MSB value of a predetermined additional address. In general, the MSB value is selected among row addresses except for bank identification address. In other words, the memory bank Bank0, Bank1, Bank2, or Bank3 is classified into a top half bank and a bottom half bank. Also, the top half bank includes a first local input/output bus LBU, write drivers and input/output sense amplifiers, while the bottom half bank separately includes a second local input/output bus LBD, write drivers and input/output sense amplifiers.

In case of a full data width, i.e., X16, the first local input/output bus LBU in the top half bank is connected to top most global input/output lines numbered from 8 to 15, and the second local input/output bus LBD in the bottom half bank is connected to bottom most global input/output lines numbered from 0 to 7. When the data width option is X8, predetermined eight of the global input/output lines are activated, and the eight global input/output lines are connected with one of the first local input/output bus LBU and the second local input/output bus LBD depending on the MSB value of the additional address. When the data width option is X4, predetermined four of the global input/output lines are activated, and the four global input/output lines are connected with one of the first local input/output line bus LBU and the second local input/output line bus LBD depending on the MSB value of the additional address.

When the data width option is X4 or X8, the memory bank structure in accordance with the present invention is classified into the top half bank and the bottom half bank depending on the MSB value of the additional address. Also, the MSB value of the additional address controls precharge of the local input/output buses, i.e., the first and the second local input/output buses LBU and LBD, respectively included in the top half bank and the bottom half bank.

Figure 3A:
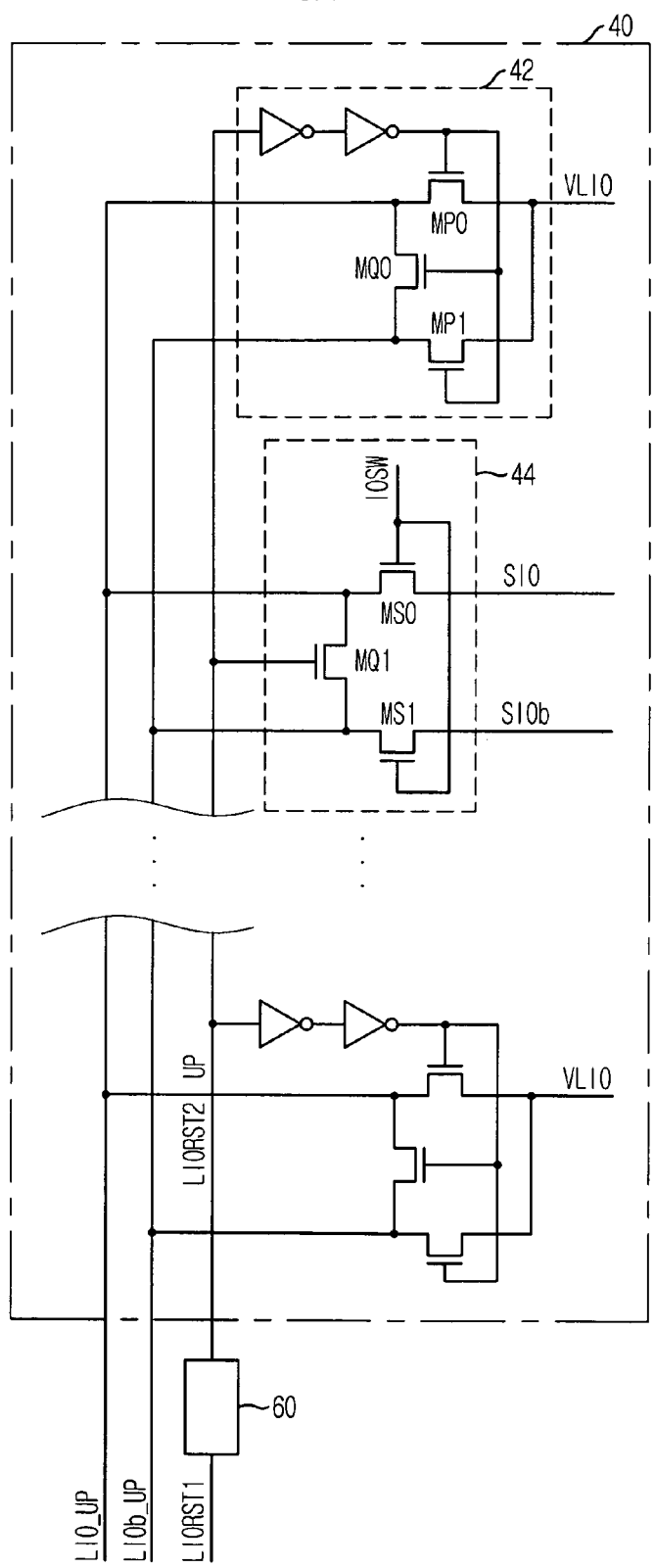
FIG. 3A is a circuit diagram showing a top local input/output line precharge block in the memory bank structure in accordance with the first embodiment of the present invention.

FIG. 3A is a circuit diagram showing a top local input/output line precharge block for performing a precharge operation with respect to the top half bank shown in FIG. 2.

As shown, the top local input/output line precharge block 40 includes a precharge unit 42 and a serial input/output (SIO) connection unit 44. The precharge unit 42 includes a pair of precharge metal oxide semiconductor (MOS) transistors MP0 and MP1 and a first equalizing MOS transistor MQ0, and the SIO connection unit 44 includes a pair of input/output switches MS0 and MS1 and a second equalizing MOS transistors MQ1. The top local input/output line precharge unit 40 is inputted with a top local input/output line precharge instruction LIORST2_UP provided from a top local input/output line precharge control unit 60 to supply a precharge voltage VLIO to a pair of local input/output lines LIO_UP and LIOb_UP and equalize the voltage level.

Figure 3B:
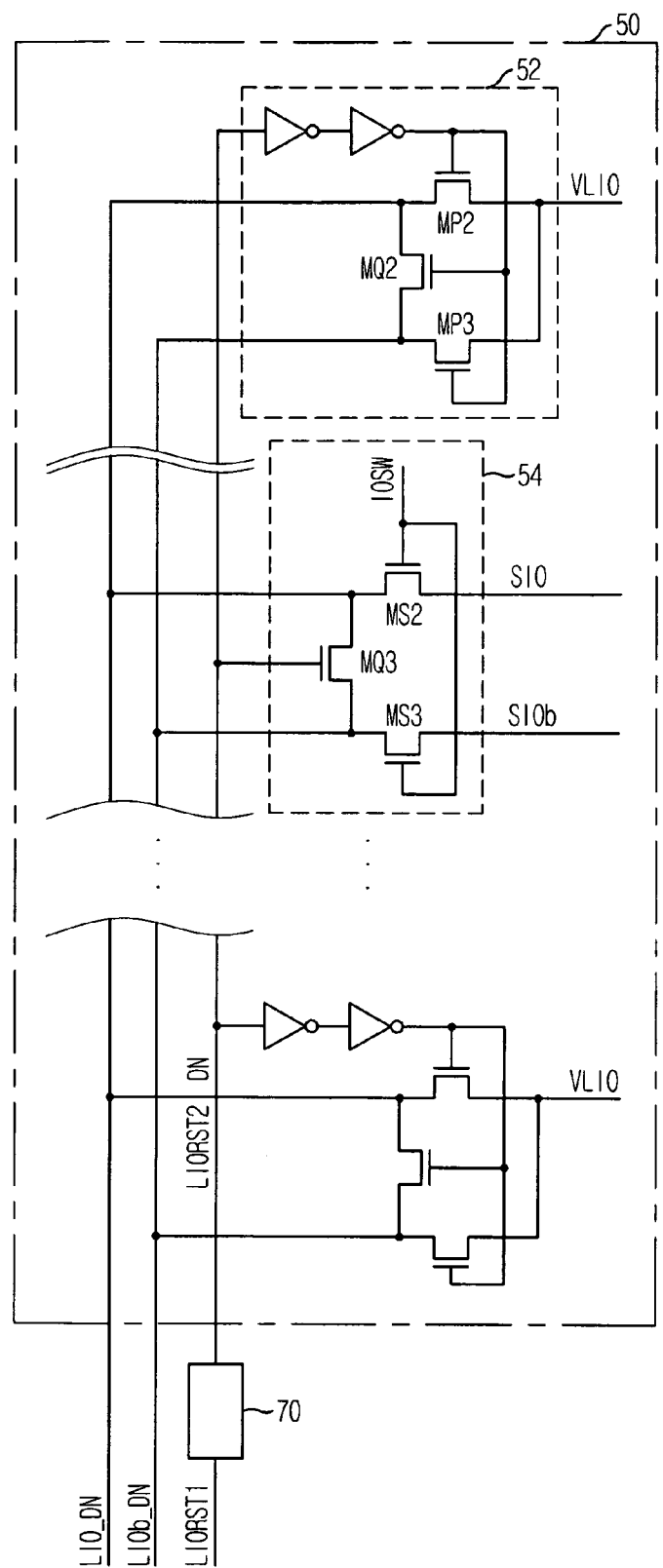
FIG. 3B is a circuit diagram showing a bottom local input/output precharge block in the memory bank structure in accordance with the first embodiment of the present invention.

FIG. 3B is a circuit diagram showing a bottom local input/output line precharge block for performing a precharge operation with respect to the bottom half bank shown in FIG. 2

As shown, the bottom local input/output precharge block 50 includes a precharge unit 52 and a SIO connection unit 54. Herein, the precharge unit 52 includes another pair of precharge MOS transistors MP2 and MP3 and a third equalizing MOS transistor MQ2, and the SIO connection unit 54 includes another pair of input/output switches MS2 and MS3 and a fourth equalizing MOS transistor MQ3. The bottom local input/output line precharge unit 50 is controlled by a bottom local input/output line precharge instruction LIORST2_DN provided from a bottom local input/output line precharge control unit 70 to thereby supply the precharge voltage VLIO to another pair of local input/output lines LIO_DN and LIOb_DN and equalizes the voltage level.

Figure 4A:
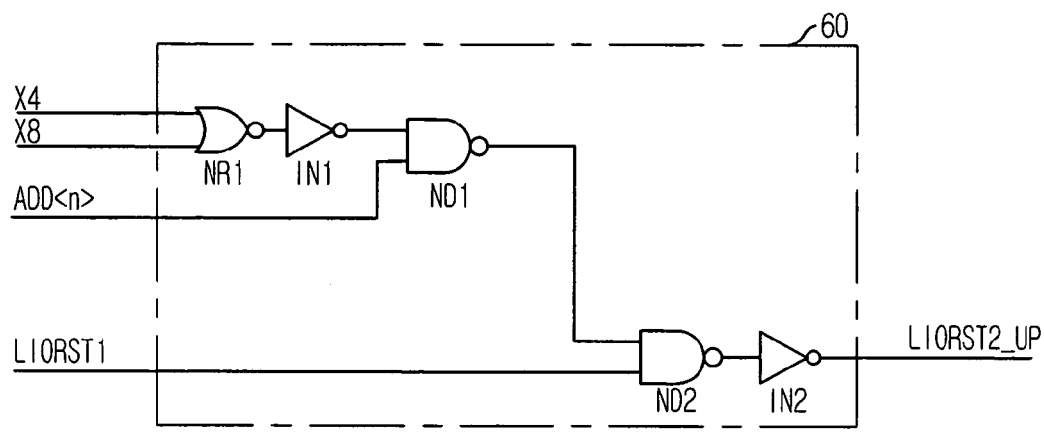
FIG. 4A is a circuit diagram showing a top local input/output line precharge control unit in the memory bank structure in accordance with the first embodiment of the present invention.

FIG. 4A is a detailed diagram showing the top local input/output line precharge control unit for controlling operation of the top local input/output line precharge block shown in FIG. 3A.

As shown, the top local input/output line precharge control unit 60 includes: a first NOR gate NR1 for receiving non-full data width option signals X4 and X8; a first inverter IN1 for inverting an output signal of the first NOR gate NR1; a first NAND gate ND1 for receiving an output signal of the first inverter IN1 and the most significant bit ADD<n> of the additional address; a second NAND gate ND2 for receiving an output signal of the first NAND gate ND1 and a bank local input/output line precharge instruction LIORST1; and a second inverter for inverting an output signal of the second NAND gate ND2 and outputting the inverted signal as the top local input/output line precharge instruction LIORST2_UP.

The top local input/output line precharge control unit 60 receives the bank local input/output line precharge instruction LIORST1, the most significant bit ADD<n> of the additional address and the non-full data width option signals X4 and X8 and, outputs the bank local input/output line precharge instruction LIORST1 as the top local input/output line precharge instruction LIORST2_UP in case of the full data width option. On the contrary, in case of the non-full data width option, i.e., the X4 option or the X8 option, the bank local input/output line precharge instruction LIORST1 is outputted as the top local input/output line precharge instruction LIORST2_UP only when the most significant bit ADD<n> of the additional address has a logic value of "0."

Figure 4B:
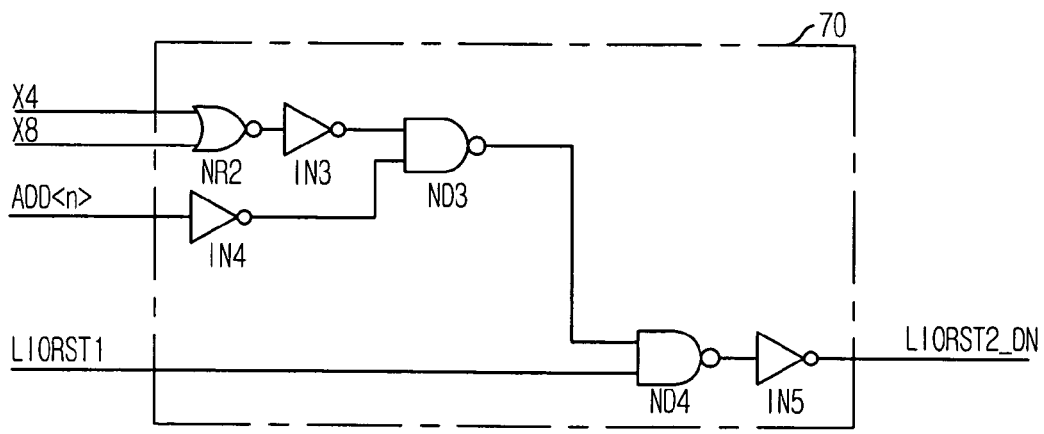
FIG. 4B is a circuit diagram showing a bottom local input/output line precharge control unit in the memory bank structure in accordance with the first embodiment of the present invention.

FIG. 4B is a diagram showing the bottom local input/output line precharge control unit for controlling operation of the bottom local input/output line precharge block shown in FIG. 3B.

As shown, the bottom local input/output line precharge control unit 70 includes: a second NOR gate NR2 for receiving the non-full data width option signals X4 and X8; a third inverter IN3 for inverting an output signal of the second NOR gate NR2; a fourth inverter IN4 for inverting the most significant bit ADD<n> of the additional address; a third NAND gate ND3 for receiving output signals of the third and the fourth inverters IN3 and IN4; a fourth NAND gate ND4 for receiving an output signal of the third NAND gate ND3 and the bank local input/output line precharge instruction LIORST1; and a fifth inverter for inverting an output signal of the fourth NAND gate ND4 and outputting the inverted signal as the bottom local input/output line precharge instruction LIORST2_DN.

The bottom local input/output line precharge control unit 70 receives the bank local input/output line precharge instruction LIORST1, the most significant bit ADD<n> of the additional address and the non-full data width option signals X4 and X8 and, outputs the bank local input/output line precharge instruction LIORST1 as the bottom local input/output line precharge instruction LIORST2_DN in case of the full data width option. On the contrary, in case of the non-full data width option, i.e., the X4 option or the X8 option, the bank local input/output line precharge instruction LIORST1 is outputted as the bottom local input/output line precharge instruction LIORST2_DN only when the most significant bit ADD<n> of the additional address has a logic value of "1."

In accordance with the first embodiment of the present invention, when the data width option is X8, the memory bank determines whether or not a specific half bank is used based on the most significant bit of the additional address, more particularly, the most significant bit among row addresses except for a bank identification address. Thus, this predetermination enables a local input/output line precharge operation to be selectively performed. That is, those memory banks that are determined not to be used are not subjected to the precharge operation. The local input/output line precharge operation applies identically when the data width option is X4.

Figure 5:
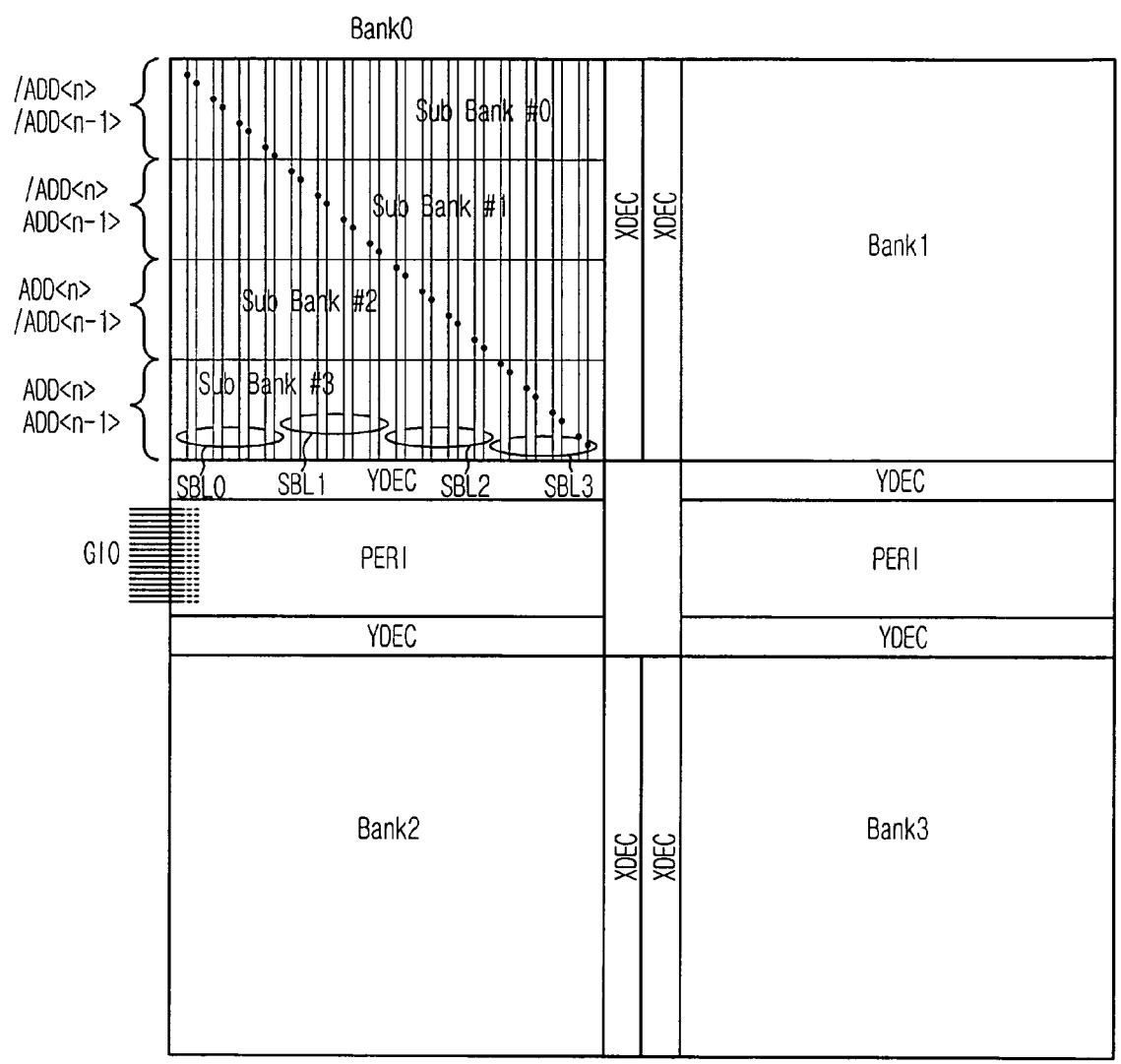
FIG. 5 is a diagram showing a memory bank structure in accordance with a second embodiment of the present invention.

FIG. 5 is a diagram showing a semiconductor memory device including a plurality of memory banks in accordance with a second embodiment of the present invention.

As shown, each of the memory bank Bank0, Bank1, Bank2, or Bank3 includes: a first sub-bank used when the most significant 2 bits of the inputted address are "00"; a second sub-bank used when the most significant 2 bits of the inputted address are "01"; a third sub-bank used when the most significant 2 bits of the inputted address are "10"; and a fourth sub-bank used when the most significant 2 bits of the inputted address are "11". Also, each memory bank Bank0, Bank1, Bank2 or Bank3 includes: a first local input/output line precharge block for performing a precharge operation with respect to local input/output lines in the first sub-bank; a second local input/output line precharge block for performing the precharge operation with respect to local input/output lines in the second sub-bank; a third local input/output line precharge block for performing the precharge operation with respect to local input/output lines in the third sub-bank; and a fourth local input/output line precharge block for performing the precharge operation with respect to local input/output lines in the fourth sub-bank.

With reference to FIG. 5, the semiconductor memory device including precharge control units will be described in more detail.

Inputting and outputting of data through the global input/output bus and the local input/output bus are identical to the first embodiment of the present invention, and the semiconductor memory device in accordance with the second embodiment includes 16 input/output pins and a global input/output line structure.

Each of the memory banks Bank0 to Bank3 is classified physically into regions depending on the most significant 2 bits of an additional address, i.e., the most significant 2 bits among row addresses except for a bank identification address. Herein, each memory bank Bank0, Bank1, Bank2 or Bank3 is classified into 4 sub-banks, i.e., the first to the fourth sub-banks. Also, local input/output lines, write drivers and input/output sense amplifiers are constructed separately for each of the first to the fourth sub-banks.

When the data width option is X16, i.e., the full data width option, a first local input/output bus LB0 in the first sub-bank is connected to global input/output lines numbered 12 to 15. A second local input/output bus LB1 in the second sub-bank is connected to global input/output lines numbered 8 to 11, and a third local input/output bus LB2 in the third sub-bank is connected to global input/output lines numbered 4 to 7. Also, a fourth local input/output bus LB3 in the fourth sub-bank is connected to global input/output lines numbered 0 to 3.

When the data width option is X8, only predetermined eight of the global input/output lines are activated, and according to the most significant bit of the additional address, the predetermined eight global input/output lines are connected to one of a group of the first and the second local input/output buses LB0 and LB1 and another group of the third and the fourth input/output buses LB2 and LB3.

When the data width option is X4, predetermined four of the global input/output lines are activated, and according to the most significant bit of the additional address and the next most significant bit of the additional address, the predetermine four global input/output lines are connected with one of the first to the fourth local input/output buses LB0 to LB3.

When the data width option is X8, the memory bank structure is classified into a top half bank including the first and the second sub-banks and a bottom half bank including the third and the fourth sub-banks depending on the most significant bit of the additional address. When the data width option is X4, the memory banks structure is classified into the four sub-banks by dividing the top and the bottom half banks based on the next most significant bit of the additional address. The precharge operation with respect to the first to the fourth local input/output bus LB0 to LB3 respectively included in the first to fourth sub-banks is controlled by the most significant bit and the next most significant bit of the additional address.

The first local input/output line precharge block includes a first precharge unit and a first SIO connection unit. The first precharge unit includes a first pair of precharge MOS transistors and first equalizing MOS transistor and the first SIO connection unit includes a first pair of input/output switches and second equalizing MOS transistor. The first local input/output line precharge block receives a first local input/output line precharge instruction LIORST2_0 provided from a first local input/output line precharge control unit to supply a precharge voltage VLIO to the corresponding local input/output lines and, equalizes voltage levels of a first pair of the local input/output lines LIO_0 and LIOb_0.

The second local input/output line precharge block includes a second precharge unit and a second connection unit. The second precharge unit includes a second pair of MOS transistors and a third equalizing MOS transistor. The second connection unit includes a second pair of input/output switches and a fourth equalizing MOS transistor. The second local input/output line precharge block receives a second local input/output line precharge instruction LIORST2_1 from a second local input/output line precharge control unit to supply the precharge voltage VLIO to the corresponding local input/output lines and, equalizes voltage levels of a second pair of the local input/output lines LIO_1 and LIOb_1.

The third local input/output line precharge block includes a third precharge unit and a third connection unit. The third precharge unit includes a third pair of MOS transistors and a fifth equalizing MOS transistor. The third connection unit includes a third pair of input/output switches and a sixth equalizing MOS transistor. The third local input/output line precharge block receives a third local input/output line precharge instruction LIORST2_2 from a third local input/output line precharge control unit to supply the precharge voltage VLIO to the corresponding local input/output lines and, equalizes voltage levels of a third pair of the local input/output lines LIO_2 and LIOb_2.

The fourth local input/output line precharge block includes a fourth precharge unit and a fourth connection unit. The fourth precharge unit includes a fourth pair of MOS transistors and a seventh equalizing MOS transistor. The fourth connection unit includes a fourth pair of input/output switches and an eighth equalizing MOS transistor. The fourth local input/output line precharge block receives a fourth local input/output line precharge instruction LIORST2_3 from a third local input/output line precharge control unit to supply the precharge voltage VLIO to the corresponding local input/output lines and, equalizes voltage levels of a fourth pair of the local input/output lines LIO_3 and LIOb_3.

Although not illustrated in the accompanying drawings, the first to the fourth local input/output line precharge blocks have the nearly same structure to the top and the bottom local input/output precharge blocks 40 and 50 shown in FIGS. 3A and 3B.

Figure 6A:
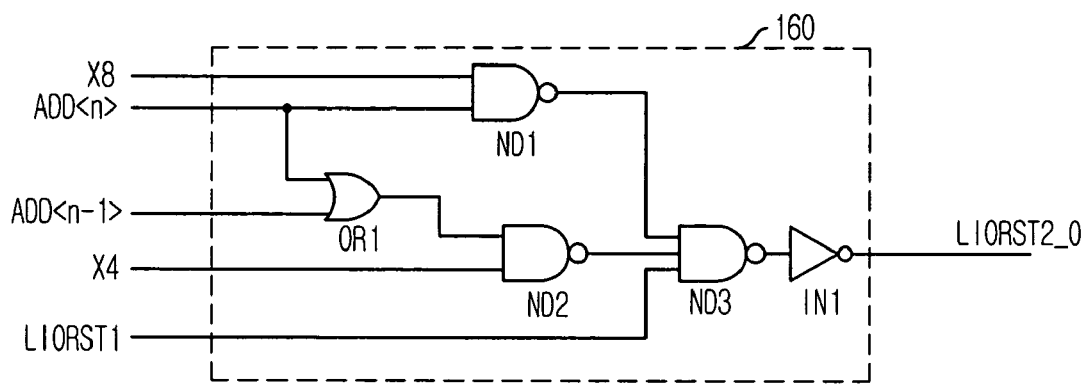
FIG. 6A is a circuit diagram showing a first local input/output line precharge control unit in accordance with the second embodiment of the present invention.

FIG. 6A is a circuit diagram showing the first local input/output line precharge control unit for controlling operation of the first local input/output line precharge block. Herein, the same reference denotations are used for the same configuration elements described in FIGS. 4A and 4B.

The first local input/output line precharge control unit 160 includes: a first NAND gate ND1 for receiving a data width option signal of X8 and the most significant bit ADD<n> of an additional address; a first OR gate OR1 for receiving the most significant bit ADD<n> of the additional address and the next most significant bit ADD<n−1> of the additional address; a second NAND gate ND2 for receiving an output signal of the first OR gate OR1 and a data width option signal of X4; a third NAND gate ND3 for receiving output signals of the first and the second NAND gates ND1 and ND2 and a bank local input/output line precharge instruction LIORST1; and a first inverter IN1 for inverting an output signal of the third NAND gate ND3 and outputting the inverted signal as the first local input/output line precharge instruction LIORST2_0.

The first local input/output line precharge control unit 160 receives the bank local input/output line precharge instruction LIORST1, the most significant bit ADD<n> of the additional address and the non-full data width option signals X4 and X8 and, outputs the bank local input/output line precharge instruction LIORST1 as the first local input/output line precharge instruction LIORST2_0 in case of the full data width option. Also, when the data width option is X8, the bank local input/output line precharge instruction LIORST1 is outputted as the first local input/output line precharge instruction LIORST2_0 when if the most significant bit ADD<n> of the additional address has a logic value of "0". When the data width option is X4, the bank local input/output line precharge instruction LIORST1 is outputted as the first local input/output line precharge instruction LIORST2_0 when if the most significant 2 bits ADD<n> and ADD<n−1> of the additional address are "00".

Figure 6B:
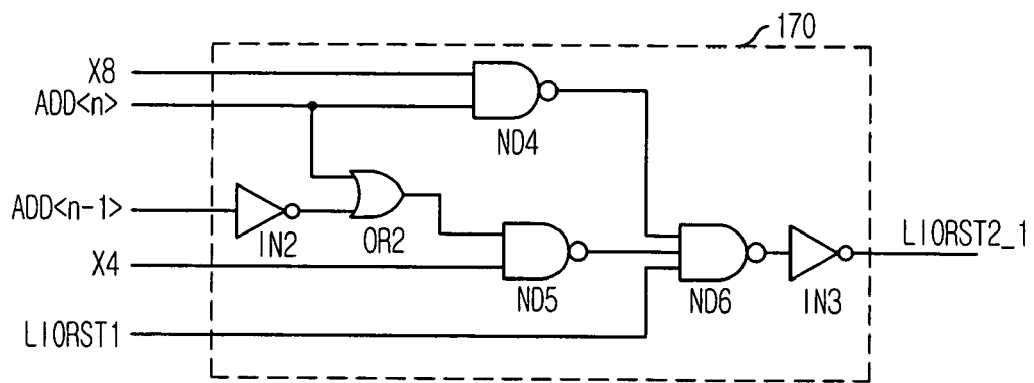
FIG. 6B is a circuit diagram showing a second local input/output line precharge control unit in accordance with the second embodiment of the present invention.

FIG. 6B is a circuit diagram showing the second local input/output line precharge control unit for controlling operation of the second local input/output line precharge block. Herein, the same reference denotations are used for the same configuration elements described in FIGS. 4A and 4B.

The second local input/output line precharge control unit 170 includes: a fourth NAND gate ND4 for receiving the data width option signal of X8 and the most significant bit ADD<n> of the additional address; a second inverter IN2 for inverting the next most significant bit ADD<n−1> of the additional address; a second OR gate OR2 for receiving the most significant bit ADD<n> of the additional address and an output signal of the second inverter IN2; a fifth NAND gate ND5 for receiving an output signal of the second OR gate OR2 and the data width option signal of X4; a sixth NAND gate ND6 for receiving output signals of the fourth and the fifth NAND gates ND4 and ND5 and the bank local input/output line precharge instruction LIORST1; and a third inverter IN3 for inverting an output signal of the sixth NAND gate ND6 and outputting the inverted signal as the second local input/output line precharge instruction LIORST2_1.

The second local input/output line precharge control unit 170 receives the bank local input/output line precharge instruction LIORST1, the most significant bit ADD<n> of the additional address and the non-full data width option signals X4 and X8 and, outputs the bank local input/output line precharge instruction LIORST1 as the second local input/output line precharge instruction LIORST2_1 in case of the full data width option. Also, when the data width option is X8, the bank local input/output line precharge instruction LIORST1 is outputted as the second local input/output line precharge instruction LIORST2_1 when if the most significant bit ADD<n> of the additional address has a logic value of "0". When the data width option is X4, the bank local input/output line precharge instruction LIORST1 is outputted as the second local input/output line precharge instruction LIORST2_1 when if the most significant 2 bits ADD<n> and ADD<n−1> of the additional address are "01".

Figure 6C:
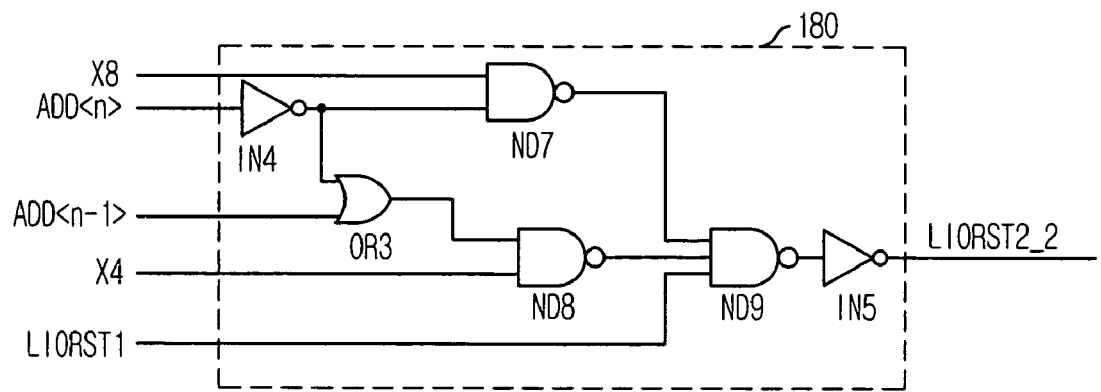
FIG. 6C is a circuit diagram showing a third local input/output line precharge control unit in accordance with the second embodiment of the present invention.

FIG. 6C is a circuit diagram showing the third local input/output line precharge control unit for controlling operation of the third local input/output line precharge block. Herein, the same reference denotations are used for the same configuration elements described in FIGS. 4A and 4B.

The third local input/output line precharge control unit 180 includes: a fourth inverter IN4 for inverting the most significant bit ADD<n> of the additional address; a seventh NAND gate ND7 for receiving the data width option signal of X8 and an output signal of the fourth inverter IN4; a third OR gate OR3 for receiving the next most significant bit ADD<n−1> of the additional address and an output signal of the fourth inverter IN4; an eighth NAND gate ND8 for receiving an output signal of the third OR gate OR3 and the data width option signal of X4; a ninth NAND gate ND9 for receiving output signals of the seventh and the eighth NAND gates ND7 and ND8 and the bank local input/output line precharge instruction LIORST1; and a fifth inverter IN5 for inverting an output signal of the ninth NAND gate ND9 and outputting the inverted signal as the third local input/output line precharge instruction LIORST2_2.

The third local input/output line precharge control unit 180 receives the bank local input/output line precharge instruction LIORST1, the most significant bit ADD<n> of the input address and the non-full data width option signals X4 and X8 and, outputs the bank local input/output line precharge instruction LIORST1 as the third local input/output line precharge instruction LIORST2_2 in case of the full data width option. Also, when the data width option is X8, the bank local input/output line precharge instruction LIORST1 is outputted as the third local input/output line precharge instruction LIORST2_2 when if the most significant bit ADD<n> of the additional address has a logic value of '1'. When the data width option is X4, the bank local input/output line precharge instruction LIORST1 is outputted as the third local input/output line precharge instruction LIORST2_2 when if the most significant 2 bits ADD<n> and ADD<n−1> of the additional address are "10".

Figure 6D:
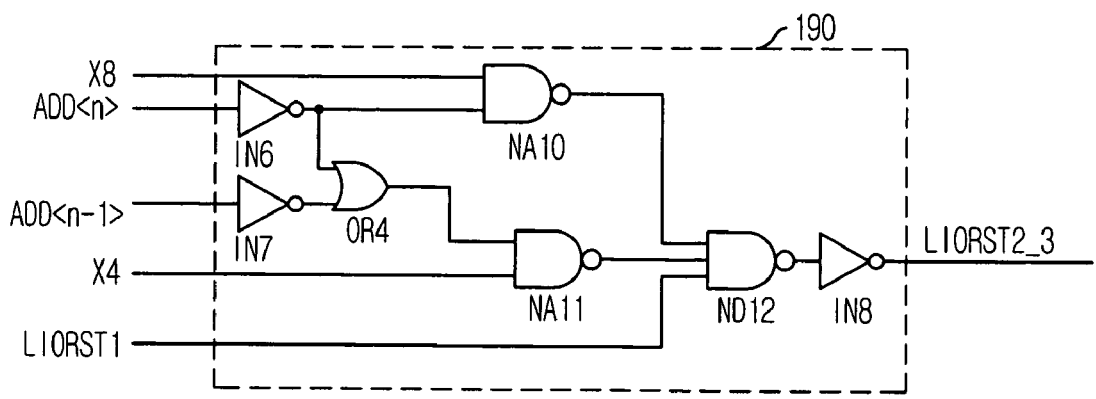
FIG. 6D is a circuit diagram showing a fourth local input/output line precharge control unit in accordance with the second embodiment of the present invention.

FIG. 6D is a circuit diagram showing the fourth local input/output line precharge control unit for controlling operation of the fourth local input/output line precharge block. Herein, the same reference denotations are used for the same configuration elements described in FIGS. 4A and 4B.

The fourth local input/output line precharge control unit 190 includes: a sixth inverter IN6 for inverting the most significant bit ADD<n> of the additional address; a tenth NAND gate ND10 for receiving the data width option signal of X8 and an output signal of the sixth inverter IN6; a seventh inverter IN7 for inverting the next most significant bit ADD<n−1> of the additional address; a fourth OR gate OR4 for receiving output signals of the sixth and the seventh inverters IN6 and IN7; an eleventh NAND gate ND11 for receiving an output signal of the fourth OR gate OR4 and the data width option signal of X4; a twelfth NAND gate ND12 for receiving output signals of the tenth and the eleventh NAND gates ND10 and ND11 and the bank local input/output line precharge instruction LIORST1; and an eighth inverter IN8 for inverting an output signal of the twelfth NAND gate ND12 and outputting the inverted signal as the fourth local input/output line precharge instruction LIORST2_3.

The fourth local input/output line precharge control unit 190 receives the bank local input/output line precharge instruction LIORST1, the most significant bit ADD<n> of the additional address and the non-full data width option signals X4 and X8 and, outputs the bank local input/output line precharge instruction LIORST1 as the fourth local input/output line precharge instruction LIORST2_3 in case of the full data width option. Also, when the data width option is X8, the bank local input/output line precharge instruction LIORST1 is outputted as the fourth local input/output line precharge instruction LIORST2_3 when if the most significant bit ADD<n> of the additional address has a logic value of "1". When the data width option is X4, the bank local input/output line precharge instruction LIORST1 is outputted as the fourth local input/output line precharge instruction LIORST2_3 when if the most significant 2 bits ADD<n> and ADD<n−1> of the additional address are "11".

In case of the data width option of X8, the memory bank structure in accordance with the second embodiment of the present invention determines whether or not a specific sub-bank is used based on the most significant bit among row addresses except for the bank identification address, whereby the local input/output line precharge operation dose not take place at those sub-banks that are not used. When the data width option is X4, the memory bank structure determines whether or not a specific sub-bank is used based on the most significant 2 bits among the row addresses except for the bank identification address, whereby the local input/output line precharge operation does not take place at those sub-banks that are not used.

The memory bank structure obtained by the first and the second embodiments of the present invention can specify a region at which the precharge operation with respect to the local input/output lines takes place depending on the data width option. As a result, it is possible to reduce the power dissipation caused by the unnecessary precharge operation even to those non-used the memory bank regions.

The present application contains subject matter related to the Korean patent application No. KR 0087669, filed in the Korean Patent Office on Oct. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A memory bank structure, comprising:
   a plurality of sub-banks identified by a predetermined additional address;
      a plurality of local input/output line precharge units for precharging local input/output lines included in each of the sub-banks; and
   a plurality of local input/output line precharge control units for controlling a precharge operation of the plurality of local input/output line precharge units by specifying a region at which the precharge operation with respect to the local input/output lines takes place depending on a data width option.

2. The memory bank structure of claim 1, wherein each of the local input/output line precharge control units receives a bank local input/output line precharge instruction, an additional address and a data width option signal and, outputs the bank local input/output line precharge instruction as a local input/output line precharge instruction with respect to the corresponding sub-bank in case of a full data width option and otherwise, as the local input/output line precharge instruction with respect to the corresponding sub-bank according to the additional address.

3. A memory bank structure, comprising:
   a top half bank used when the most significant bit of a predetermined additional address has a first logic value;
   a bottom half bank used when the most significant bit of the predetermined address has a second logic value;
      a top local input/output line precharge unit for performing a precharge operation with respect to local input/output lines in the top half bank;
      a bottom local input/output line precharge unit for performing a precharge operation with respect to local input/output lines in the bottom half bank;
   a top, local input/output line precharge control unit for controlling the top local input/output line precharge unit; and
   a bottom local input/output line precharge control unit for controlling the bottom local input/output line precharge unit.

4. The memory bank structure of claim 3, wherein the top local input/output line precharge control unit receives a bank local input/output line precharge instruction, the most significant bit of an additional address and a data width option signal and, outputs the bank local input/output line precharge instruction as a top local input/output line precharge instruction in case of a full data width option and otherwise, as the top local input/output line precharge instruction according to the most significant bit of the additional address.

5. The memory bank structure of claim 3, wherein the bottom local input/output line precharge control unit receives a bank local input/output line precharge instruction, the most significant bit of an additional address and a data width option signal and, outputs the bank local input/output line precharge instruction as a bottom local input/output line precharge instruction in case of a full data width option and otherwise, as the bottom local input/output line precharge instruction according to the most significant bit of the additional address.

6. The memory bank structure of claim 3, wherein the top local input/output line precharge control unit includes:
   an NOR gate for receiving non-full data width option signals;
   a first inverter for inverting an output signal of the NOR gate;
   a first NAND gate for receiving an output signal of the first inverter and the most significant bit of an additional address;
   a second NAND gate for receiving an output signal of the first NAND gate and a bank local input/output line precharge instruction; and
   a second inverter for inverting an output signal of the second NAND gate and outputting the inverted signal as a top local input/output line precharge instruction.

7. The memory bank structure of claim 3, wherein the bottom local input/output line precharge control unit includes:
   an NOR gate for receiving non-full data width option signals;
   a first inverter for inverting an output signal of the NOR gate;
   a second inverter for inverting the most significant bit of an additional address;
   a first NAND gate for receiving output signals of the first and the second inverters;
   a second NAND gate for receiving an output signal of the first NAND gate and a bank local input/output line precharge instruction; and
   a third inverter for inverting an output signal of the second NAND gate and outputting the inverted signal as a bottom local input/output line precharge instruction.

8. A memory bank structure, comprising:
   a first to a fourth sub-banks being usable according to a logic value of an additional address;
   a first to a fourth local input/output line precharge units for performing a precharge operation with respect to individual local input/output lines of the first to the fourth sub-banks; and
   a first to a fourth local input/output line precharge control units for controlling the first to the fourth local input/ output line precharge units by specifying a region at which the precharge operation with respect to the individual local input/output lines takes place depending on a data width option.

9. The memory bank structure of claim 8, wherein each of the first to the fourth local input/output line precharge control units receives a bank local input/output line precharge instruction, the most significant 2 bits of an additional address and data width option signals and, if the data width option signal is X16, outputs the bank local input/output line precharge instruction as a local input/output line precharge instruction for the corresponding sub-bank; if the data width option signal is X8, outputs the bank local input/output line precharge instruction as a local input/output line precharge instruction for the corresponding sub-bank according to a logic value of the most significant bit of the additional address; and if the data width option signal is X4, outputs the bank local input/output line precharge instruction as a local input/output line precharge instruction for the corresponding local input/output line precharge instruction according to the most significant 2 bits of the additional address.

10. The memory bank structure of claim 8, wherein the first local input/output line precharge control unit includes:
   an OR gate for receiving the most significant bit of the additional address and the next most significant bit of the additional address;
   a first NAND gate for receiving a data width option signal of X8 and the most significant bit of the additional address;
   a second NAND gate for receiving an output signal of the OR gate and a data width option signal of X4;
   a third NAND gate for receiving output signals of the first and the second NAND gates and a bank local input/output line precharge instruction; and
   an inverter for inverting an output signal of the third NAND gate ND3 and outputting the inverted signal as the first local input/output line precharge instruction.

11. The memory bank structure of claim 8, wherein the second local input/output line precharge control unit includes:
   a first NAND gate for receiving a data width option signal of X8 and the most significant bit of the additional address;
   a first inverter for inverting the next most significant bit of the additional address;
   an OR gate for receiving the most significant bit of the additional address and an output signal of the first inverter;
   a second NAND gate for receiving an output signal of the OR gate and a data width option signal of X4;
   a third NAND gate for receiving output signals of the first and the second NAND gates and a bank local input/output line precharge instruction; and
   a second inverter for inverting an output signal of the third NAND gate and outputting the inverted signal as the second local input/output line precharge instruction.

12. The memory bank structure of claim 8, wherein the third local input/output line precharge control unit includes:
   a first inverter for inverting the most significant bit of the additional address;
   a first NAND gate for receiving a data width option signal of X8 and an output signal of the first inverter;
   an OR gate for receiving the next most significant bit of the additional address and an output signal of the first inverter;
   a second NAND gate for receiving an output of the OR gate and a data width option signal of X4;
   a third NAND gate for receiving output signals of the first and the second NAND gates and a bank local input/output line precharge instruction; and
   a second inverter for inverting an output signal of the third NAND gate and outputting the inverted signal as the third local input/output line precharge instruction.

13. The memory bank structure of claim 8, wherein the fourth local input/output line precharge control unit includes:
   a first inverter for inverting the most significant bit of the additional address;
   a first NAND gate for receiving a data width option signal of X8 and an output signal of the first inverter;
   a second inverter for inverting the next most significant bit of the additional address;
   an OR gate for receiving output signals of the first and the second inverters;
   a second NAND gate for receiving an output signal of the OR gate and a data width option signal of X4;
   a third NAND gate for receiving output signals of the first and the second NAND gates and a bank local input/output line precharge instruction; and
   a third inverter for inverting an output signal of the third NAND gate and outputting the inverted signal as the fourth local input/output line precharge instruction.

* * * * *